US010134875B2

(12) United States Patent
Reboh et al.

(10) Patent No.: US 10,134,875 B2
(45) Date of Patent: Nov. 20, 2018

(54) METHOD FOR FABRICATING A TRANSISTOR HAVING A VERTICAL CHANNEL HAVING NANO LAYERS

(71) Applicant: Commissariat a l'energie atomique et aux energies alternatives, Paris (FR)

(72) Inventors: Shay Reboh, Guilderland, NY (US); Emmanuel Augendre, Montbonnot (FR); Remi Coquand, Les Marches (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/842,245

(22) Filed: Dec. 14, 2017

(65) Prior Publication Data

US 2018/0204931 A1    Jul. 19, 2018

(30) Foreign Application Priority Data

Dec. 15, 2016 (FR) ...................................... 16 62566

(51) Int. Cl.
*H01L 21/336* (2006.01)
*H01L 29/66* (2006.01)
(Continued)

(52) U.S. Cl.
CPC .. *H01L 29/66742* (2013.01); *H01L 21/02236* (2013.01); *H01L 21/02532* (2013.01);
(Continued)

(58) Field of Classification Search
CPC ....... H01L 21/823468; H01L 21/02236; H01L 21/02532; H01L 29/6653; H01L 29/6656; H01L 29/66742
(Continued)

(56) References Cited

U.S. PATENT DOCUMENTS 5,689,127 A  11/1997 Chu et al.
5,780,327 A  7/1998 Chu et al.
(Continued)

OTHER PUBLICATIONS

French Preliminary Search Report dated Aug. 22, 2017 in French Application 16 62566 filed on Dec. 15, 2016 (with English Translation of Categories of Cited Documents and Written Opinion).
(Continued)

*Primary Examiner* — David S Blum
(74) *Attorney, Agent, or Firm* — Oblon, McClelland, Maier & Neustadt, L.L.P.

(57) ABSTRACT

The invention relates to a process for fabricating a vertical transistor, comprising the step of providing a substrate surmounted by a stack of first, second and third layers made of first, second and third semiconductors, respectively, said second semiconductor being different from the first and third semiconductors. The process further includes horizontally growing first, second and third dielectric layers, by oxidation, from the first, second and third semiconductor layers, respectively, with a second dielectric layer, the thickness of which differs from the thickness of said first and third dielectric layers and removing the second dielectric layer so as to form a recess that is vertically self-aligned with the second semiconductor layer, which recess is positioned vertically between first and second blocks that are made facing the first and third semiconductor layers. Finally, the process includes forming a gate stack in said self-aligned recess.

15 Claims, 14 Drawing Sheets

(51) Int. Cl.
*H01L 29/06* (2006.01)
*H01L 29/423* (2006.01)
*H01L 29/786* (2006.01)
*H01L 21/311* (2006.01)
*H01L 21/02* (2006.01)
*H01L 21/8234* (2006.01)

(52) U.S. Cl.
CPC .. *H01L 21/02603* (2013.01); *H01L 21/31116* (2013.01); *H01L 21/823468* (2013.01); *H01L 29/0673* (2013.01); *H01L 29/42392* (2013.01); *H01L 29/6653* (2013.01); *H01L 29/78618* (2013.01); *H01L 29/78642* (2013.01); *H01L 29/78696* (2013.01)

(58) Field of Classification Search
USPC .......................................................... 438/268
See application file for complete search history.

(56) References Cited

U.S. PATENT DOCUMENTS

| | | | |
|---|---|---|---|
| 9,728,542 B1 * | 8/2017 | Balakrishnan | H01L 27/11206 |
| 10,014,391 B2 * | 7/2018 | Bergendahl | H01L 29/785 |
| 2003/0116792 A1 | 6/2003 | Chen et al. | |
| 2011/0068418 A1 | 3/2011 | Lung | |
| 2015/0364560 A1 | 12/2015 | Wang et al. | |

OTHER PUBLICATIONS

Yi-Chia Chou et al., "Nucleation and growth of epitaxial silicide in silicon nanowires," Materials Science and Engineering R 70, 112-125, 2010, pp. 14.

J. Borrel et al., "Considerations for Efficient Contact Resistivity Reduction via Fermi Level Depinning—Impact of MIS Contacts on 10nm Node nMOSFET DC Characteristics," Symposium on VLSI Technology Digest of Technical Papers, 2015, pp. 2.

* cited by examiner

Fig. 1
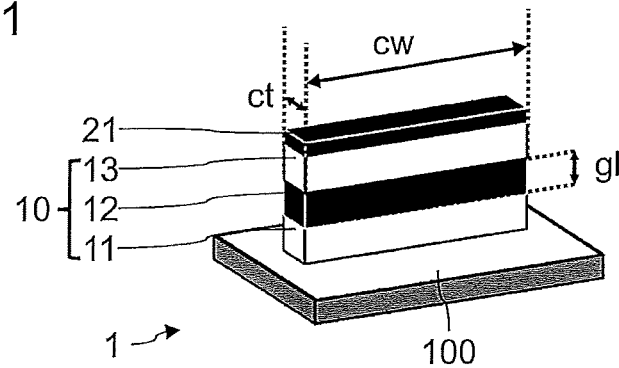
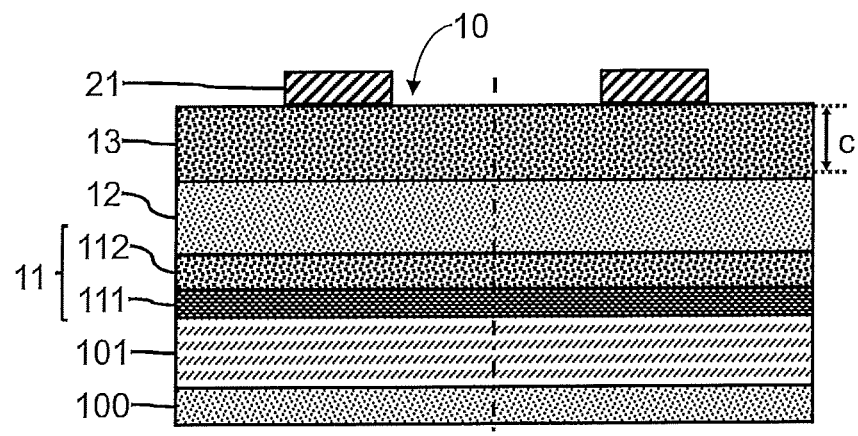
Fig. 2
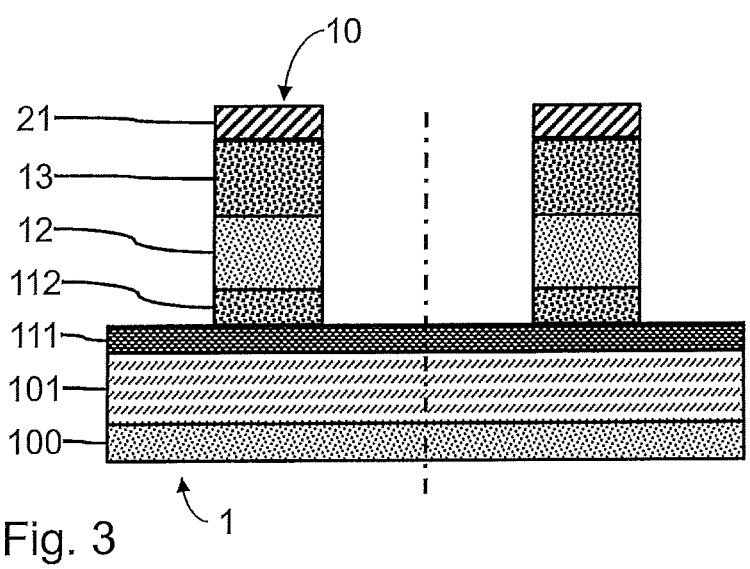
Fig. 3

Fig. 16
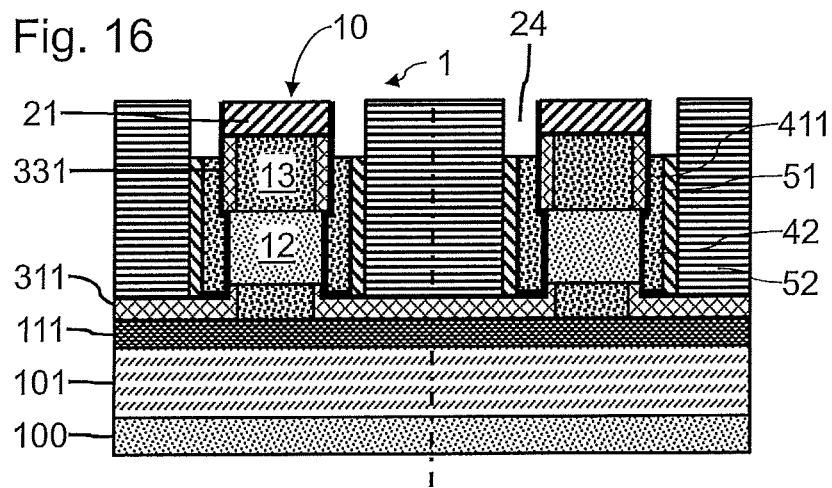
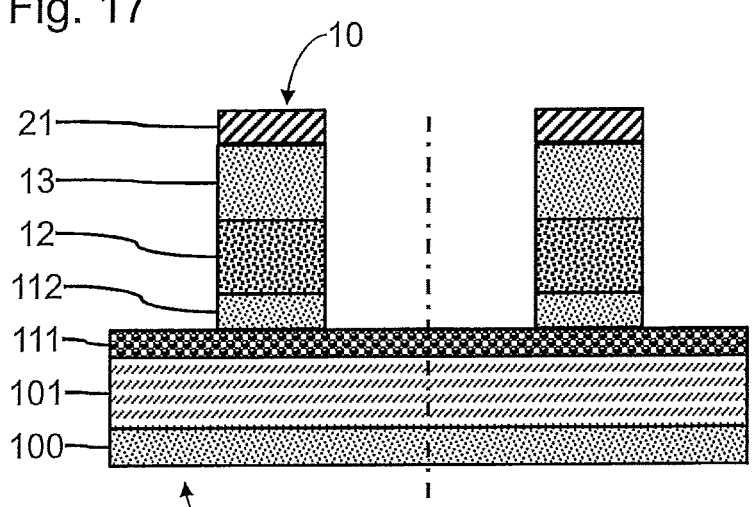
Fig. 17
Fig. 18

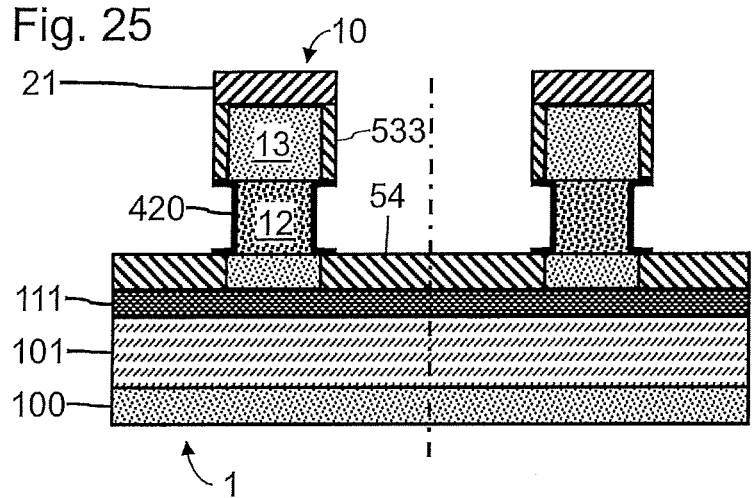
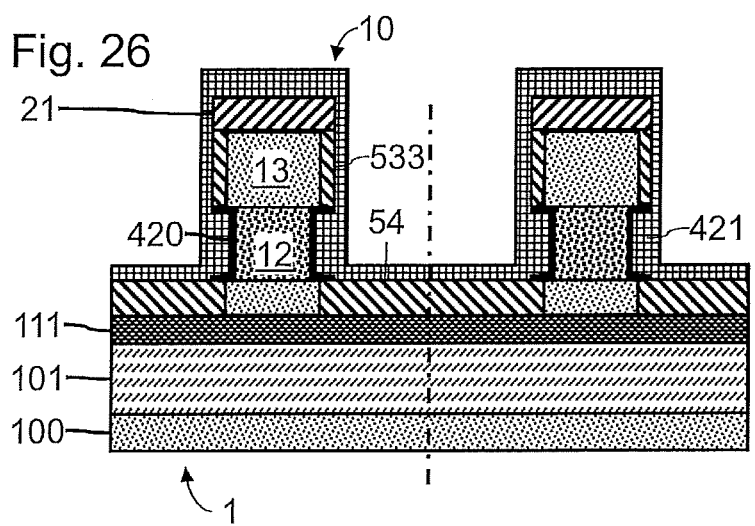
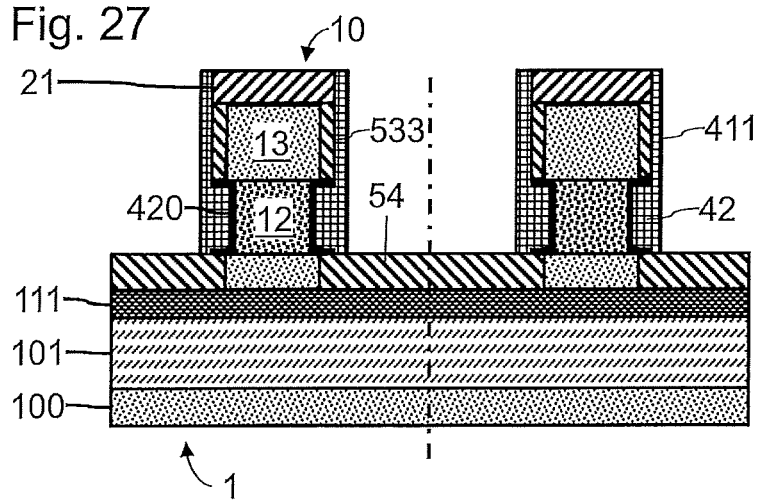

METHOD FOR FABRICATING A TRANSISTOR HAVING A VERTICAL CHANNEL HAVING NANO LAYERS

The invention relates to vertical-channel transistors and in particular to processes for fabricating such transistors.

The increase in the performance levels of integrated circuits due to the miniaturization of field-effect transistors is confronted with a technological and scientific roadblock. One of the underlying problems is the increase in static and dynamic power in integrated circuits. In order to decrease this consumed power, new architectures and new materials that will allow a low operating voltage to be obtained are being intensively studied at the present time.

In particular, for technological nodes under 50 nm, electrostatic control of the channel by the gate becomes a predominant operating parameter for the operation of the transistor. To improve this electrostatic control, various multiple-gate transistor technologies are being researched; in particular, gate-all-around nanowire transistors are being researched. However, the very small available gate length of gate-all-around transistors makes them difficult to fabricate and limits the capacity to obtain high currents in the on state.

In order to allow longer gate lengths while preserving a planar integration density similar to that of gate-all-around transistors, vertical-channel nanolayer transistor structures have been proposed. The difficulty with such transistors is that their structure is very different from that of planar field-effect transistors. These structural differences entail very different fabricating processes. The sources of manufacturing variability are thus very different and the dimensional design rules governing the layout of vertical transistors are also very different, thereby making industrialization of such transistors even more problematic. In particular, the usual processes for fabricating such transistors comprise, in sequence, steps of deposition, lithography and etching for the various layers of the vertical transistor. Each deposition operation is usually performed by epitaxy and followed by a shaping operation, in order to form a source/channel/drain stack. One difficulty lies in ensuring that the gate is properly vertically aligned with respect to the channel.

The invention aims to overcome one or more of these drawbacks. The invention thus pertains to a process for fabricating a vertical transistor, such as is defined in the appended claims.

Other features and advantages of the invention will become clearly apparent from the description that is given thereof below, by way of completely non-limiting indication, with reference to the appended drawings, in which:

FIG. 1 is a schematic perspective view of a nanowire stack for a vertical-channel field-effect transistor, illustrating dimensional parameters of the channel;

FIGS. 2 to 13 are cross-sectional views during various steps of a process for fabricating vertical-channel field-effect transistors according to one example of a first embodiment of the invention;

FIGS. 14 to 16 are cross-sectional views at various sites after etching steps for forming transistor contacts;

FIGS. 17 to 32 are cross-sectional views during various steps of a process for fabricating vertical-channel field-effect transistors according to one example of a second embodiment of the invention;

Figure 4:
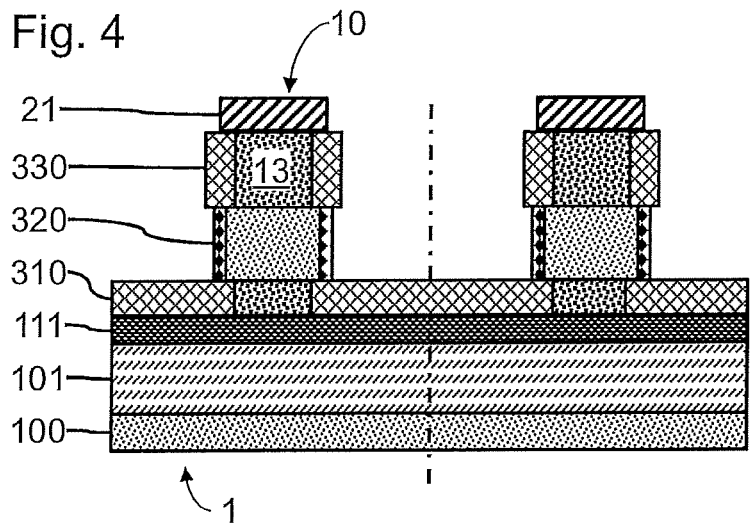

FIG. 1 is a schematic perspective view of a stack 10 of nanowire or nanolayer layers, which stack is able to form the substructure of a vertical-channel field-effect transistor 1. A layer 11 of a first semiconductor, a layer 12 of a second semiconductor and a layer 13 of a third semiconductor are superposed in the stack 10, which is formed on a substrate 100. Although not illustrated, the substrate 100 and the stack 10 may be separated by a well and/or deep trench isolations. The layers 11 to 13 are nanowire or nanolayer layers. The layer 13 is covered by one (or more) dielectric layers 21 forming a hard mask. The layers 11 and 13 are intended to form first and second conductive electrodes of the transistor, the layer 12 being intended to form the channel zone of this transistor. The semiconductor of the layer 12 is different from that of the layers 11 and 13.

The layers 11 and 13 are advantageously made from the same semiconductor. The layers 11 and 13 are typically doped with a view to optimizing their electrical properties. By way of example, the substrate 100 is a bulk substrate, for example a silicon substrate. The layers 11 and 13 are for example initially made of a silicon-germanium alloy (they are for example made of doped SiGe, for example of B-doped SiGe), and the layer 12 may be made of unintentionally doped silicon (or for example silicon that has been doped with the intention of modifying the threshold voltage of the transistor to be formed). The dielectric layer 21 is for example made of SiN. Other materials may of course be envisaged in the context of the invention. It is for example possible to envisage producing the layers 11 and 13 from silicon (or from doped silicon, p-doped silicon for example) and to produce the layer 12 from a silicon-germanium alloy. It is also possible to envisage producing the layers 11 to 13 from III-V semiconductors (InGaAs, InP, etc. for example).

FIG. 1 illustrates the dimensional parameters of the channel zone of the transistor 1 produced with a stack 10. Assuming that the layer 12 corresponds to the definitive shape of the channel zone of the transistor, such a transistor has a gate length or channel length gl (dimension along the normal to the substrate 100) corresponding to the thickness of the layer 12, a channel width cw corresponding to the length (dimension in the longitudinal direction) of the layer 12, and a channel thickness ct corresponding to the width (dimension in the transverse direction) of the layer 12. In order to achieve both a high on-state current and good electrostatic control of the channel, the value cw is advantageously at least equal to 2 times the value ct.

FIGS. 2 to 13 are cross-sectional views of an example of a transistor 1 in various steps of an example of a first embodiment of a fabricating process according to the invention. The aim of the fabricating process illustrated here is to fabricate two vertical transistors, the sources of which are electrically connected, but it may be applied to the fabrication of other transistor configurations. The aim of the first embodiment is to grow a thermal oxide laterally on a channel layer, with a low thickness with respect to a thermal oxide at the source and at the drain, in order to be able to benefit from a self-alignment of the gate.

In FIG. 2, a substrate 100 such as described above is provided. The substrate 100 is here surmounted by a semiconductor layer 101, which is used as a well. A well may also be formed by ion implantation into the substrate 100. The semiconductor layer 101 is here surmounted by a stack 10 of semiconductor layers. The invention is also applicable in the absence of such a layer 101 between the substrate 100 and the stack 10.

The stack 10 here comprises a layer 11 made of silicon-germanium alloy (surmounting the layer 101), a layer 12 made of silicon formed on the layer 11, and a layer 13 made of silicon-germanium alloy formed on the layer 12. The stack 10 is here formed for producing a pMOS transistor 1.

The layer 11 here comprises the superposition of a layer 111 formed on the layer 101, and of a layer 112 formed on the layer 111. The layers 111 and 112 advantageously have, for example, different concentrations of germanium. The layer 111 may also advantageously have a different composition (for example a difference in doping) from the layer 112, such that the etch stop on the layer 111 may be effective in later process steps. The layer 112 here has the same composition as the layer 13. The invention also applies, of course, to a layer 11 having a uniform composition. The silicon-germanium alloy may be doped with boron for example with a dopant concentration comprised between $5 \times 10^{19}$ cm$^{-3}$ and $5 \times 10^{20}$ cm$^{-3}$ (or higher if technologically feasible) and preferably equal to $2 \times 10^{20}$ cm$^{-3}$.

The stack of the layers 11 to 13 may be obtained beforehand via epitaxial growth steps, in a way known per se. The materials of the layers 11 to 13 are selected according to the electrical performance levels desired for the transistor 1, and so as to be able to grow a thermal oxide laterally from the layer 12 at a different rate of growth than that of thermal oxides formed laterally from the layers 11 and 13. The type of doping of the layer 101 is advantageously opposite to that of the layer 111, in order to limit leakages in the direction of the substrate 100.

The stack of the layers 11 to 13 here has a thickness typically comprised between 10 and 300 nanometers. The layer 12 has a thickness typically comprised between 5 and 100 nm (30 nm for example), the definition of its thickness facilitating the definition of the electrical length of the channel. The layers 11 and 13 may have the same thickness or different thicknesses, for example with a view to adjusting their electrical resistances. The layers 11 and 13 typically have respective thicknesses comprised between 5 and 100 nm (30 nm for example). In order to decrease the resistance at the source or drain of a transistor 1, their thickness is advantageously at most equal to 25 nm. A lower value for the respective thicknesses of the layers 11 to 13 also facilitates the later formation of spacers.

The layer 13 is covered with a dielectric layer 21. The dielectric layer 21 is typically made of SiN, of $SiO_2$ or of a combination of these two materials. The layer 21 forms a hard mask for the stack. The layer 21 here has a width comprised between 10 and 100 nanometers (40 nm for example), corresponding to the width ct that is desired to be defined for the stack.

In FIG. 3, the dielectric layer 21 is used for anisotropically etching (for example by means of reactive ion etching, referred to as RIE) the layers 13, 12 and 112, so that they have substantially one and the same length and one and the same width, corresponding to the pattern of the dielectric layer 21. The etching operation is interrupted when the layer 111 is exposed on the side of the stacks 10.

In FIG. 4, a step of growing dielectric by thermal oxidation on the sides of the layers 112, 12 and 13 is implemented. dielectric is also grown vertically on the layer 111. The dielectrics are formed by thermal oxidation of the layers 111, 112, 12 and 13, respectively (for example rapid thermal oxidation, or RTO, at a process temperature that is typically comprised between 750 and 1150° C.). On completion of this step, a dielectric layer 330 is formed laterally on the layer 13, a dielectric layer 320 is formed laterally on the layer 12, and a dielectric layer 310 is formed laterally on the layer 112 and vertically on the layer 111.

The rates of growth of the dielectric oxides from a silicon-germanium alloy layer increase with the germanium content of this layer. The document "Needs of low thermal budget processing in SiGe Technology", by U. König et al., provides, in particular, results for the rates of growth of oxide layers by rapid thermal oxidation processes, according to the oxidation temperature and the proportion of germanium in a silicon-germanium alloy. The rate of growth of the oxide for each of the layers may also depend on the pressure, on the temperature and on the oxygen content during oxidation (and potentially on other experimental factors).

With a layer 12 having no germanium content or a proportion of germanium that is significantly lower than that of the layers 13, 111 and 112, the rate of growth of the dielectric by thermal oxidation on the side of the layer 12 is much lower than the rate of growth of dielectric by thermal oxidation on the side of the layers 13 and 112. Thus, on completion of the thermal oxidation step, the thickness (the dimension in the horizontal direction) of the dielectric layer 320 is lower than that of the dielectric layer 330 or than that of the dielectric layer 310. It is also possible, for example, to envisage forming a dielectric layer 320 having a thickness comprised between 1 and 5 nm, for a dielectric layer 330 having a thickness of 10 nm. The difference in growth rate can be observed at the interface between the layer 12 and the layers 112 and 13, respectively. Consequently, the layer 320 is vertically self-aligned with the interfaces of the layer 12 with the layers 13 and 112, respectively. With a layer 13 and a layer 112 having the same composition, the rate of lateral growth of the dielectric layers 310 and 330 is identical.

Figure 5:
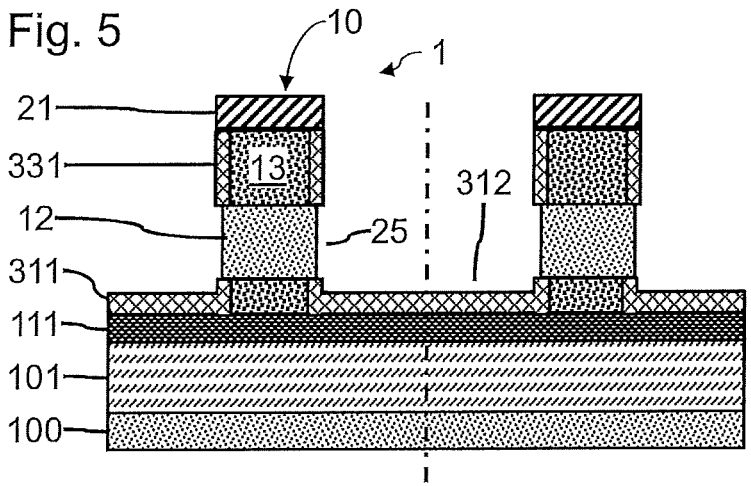

In FIG. 5, the layers 310, 320 and 330 are isotropically etched:
to a thickness that is low enough to retain a portion of the dielectric layers 310 and 330;
to a thickness that is sufficient to remove the dielectric layer 320, and to form a recess 25 between the dielectric layers 310 and 330.

Spacers 331 are thus formed on either side of the layer 13, and a spacer layer 311 is formed on either side of the layer 112. A vertical recess 312 is made in the spacer 311. The etching operation is for example a dry etching operation such as atomic layer etching (ALE) or reactive ion etching (RIE). It is possible to use an isotropic etching process for which the etching speed is substantially identical for the various dielectric layers 310, 320 and 330.

Figure 6:
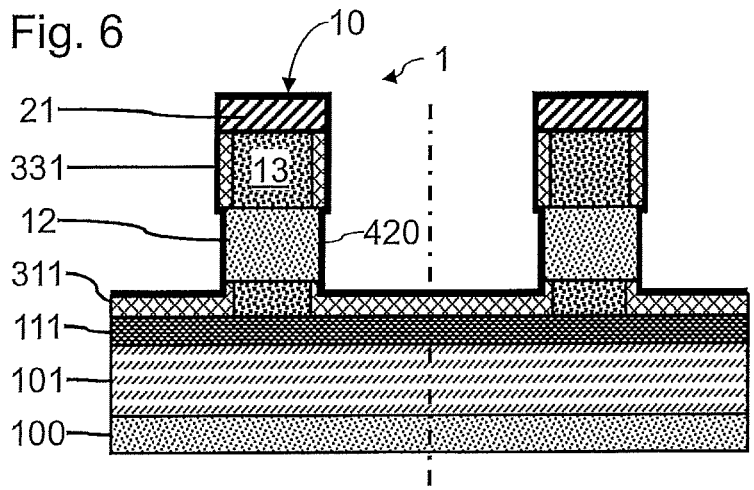

In FIG. 6, a dielectric layer 420 is deposited by conformal deposition. In this example, the dielectric of the layer 420 is an Hk dielectric, i.e. it has a dielectric constant at least equal to 6. The dielectric of the layer 420 is for example HfO$_2$ (for example deposited by atomic layer deposition). The dielectric of the layer 420 is for example deposited to a thickness of at most 3 nm. Advantageously, an interface layer (not shown here), for example made of SiO$_2$ having a thickness comprised between 1 and 2 nm, may be deposited beforehand. The layer 420 then covers, in particular, the lateral faces of the layer 12. The layer 420 is intended to form the gate insulator.

Figure 7:
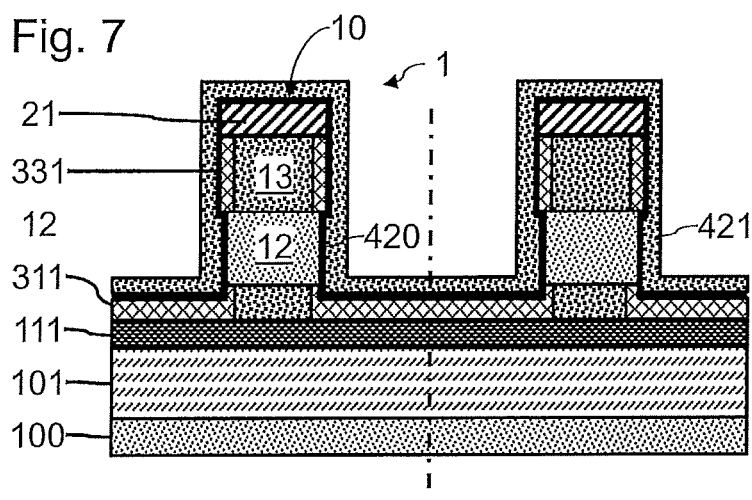

In FIG. 7, a conductive layer 421 is deposited by conformal deposition. In this example, the gate material, corresponding to the layer 421, is TiN. The material of the layer 421 is for example deposited to a thickness of at least 3 nm. The layer 421 is in particular deposited on the layer 420. The layer 421 forming the gate material is for example deposited with an atomic layer deposition process. The step illustrated in FIG. 7 may be preceded by an operation of anisotropically etching the layer 420, so as to retain the layer 420 only on either side of the layer 12.

Figure 8:
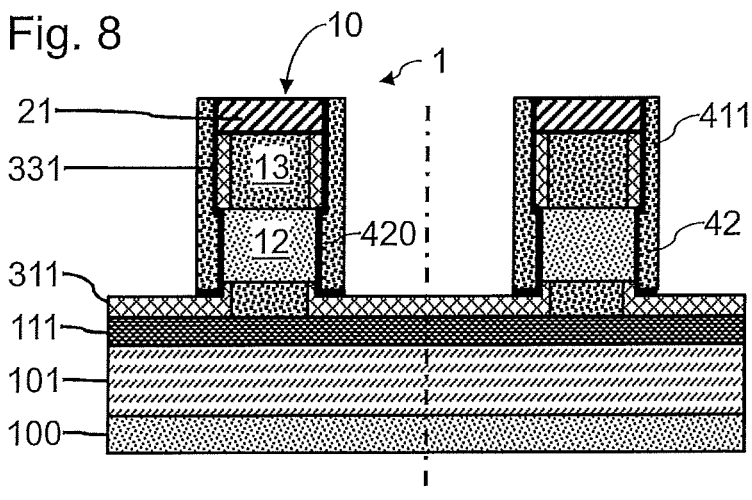

In FIG. 8, the layer 421 and the layer 420 are etched, advantageously so as to expose the upper face of the dielectric layer 21 and so as to expose the spacer layers 311 on either side of the stacks 10. The layer 421 is preserved on either side of the layers 12 and 13. A gate 42 is then made on either side of the layer 12 (on the lateral faces of the layer 12). Each gate 42 is extended vertically upward by a contact portion 411, on either side of the layer 11. Each gate 42 is electrically insulated from the layer 111 via spacer layers 311. For a layer 421 of sufficient thickness, isotropic etching may be carried out. If the layer 421 is made of TiN, isotropic RIE or ICP etching may be carried out, for example. The gate 42 thus obtained thus exhibits vertical self-alignment with respect to the layer 12.

The process may be implemented so as to form a gate 42 girdling the entire layer 12. A gate-all-around transistor 1 may thus be formed, the entire channel zone then being girdled by the gate 42. The gate 42 may thus be biased to one and the same potential all around the layer 12 forming the channel zone.

Figure 9:
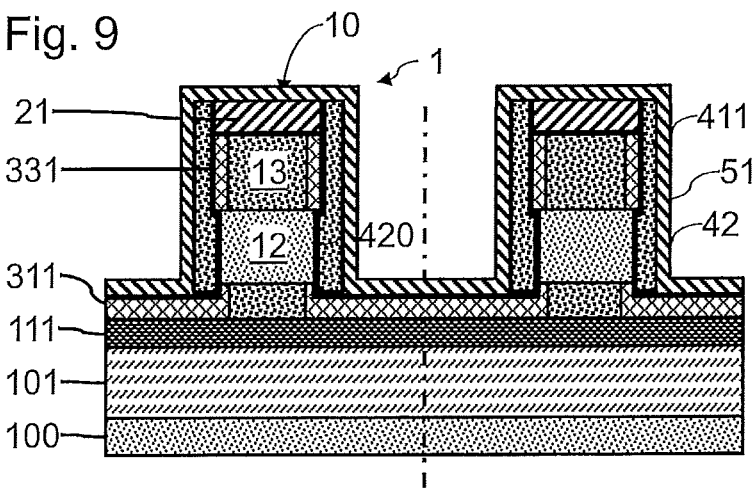

In FIG. 9, a dielectric layer 51 is deposited by conformal deposition. The layer 51 is typically an SiBCN layer. Each stack 10 is thus encapsulated in the layer 51. Similarly, the gate 42 and the contact portion 411 of a transistor 1 are encapsulated in the layer 51. The layer 51 for example has a thickness of 10 nm. SiN may for example be deposited by an atomic layer deposition process.

Figure 10:
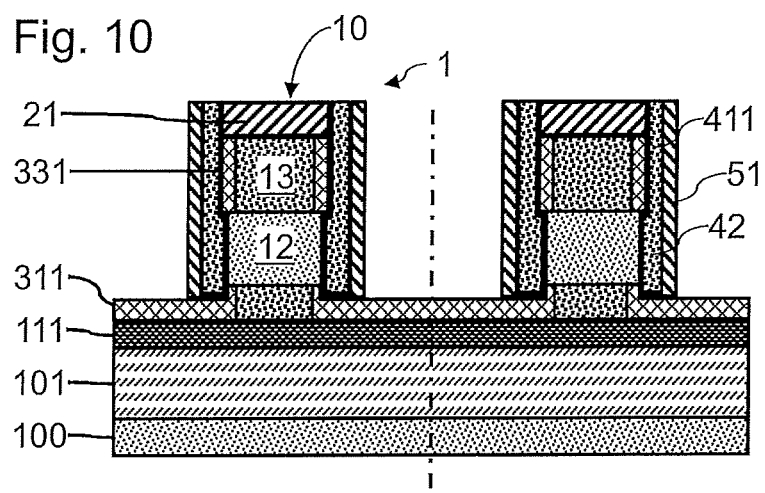

In a step shown in FIG. 10, the layer 51 is anisotropically etched to a thickness that is sufficient to expose the upper face of the layer 21 and of the spacer layer 311, while retaining this layer 51 on either side of the stacks 10.

Figure 11:
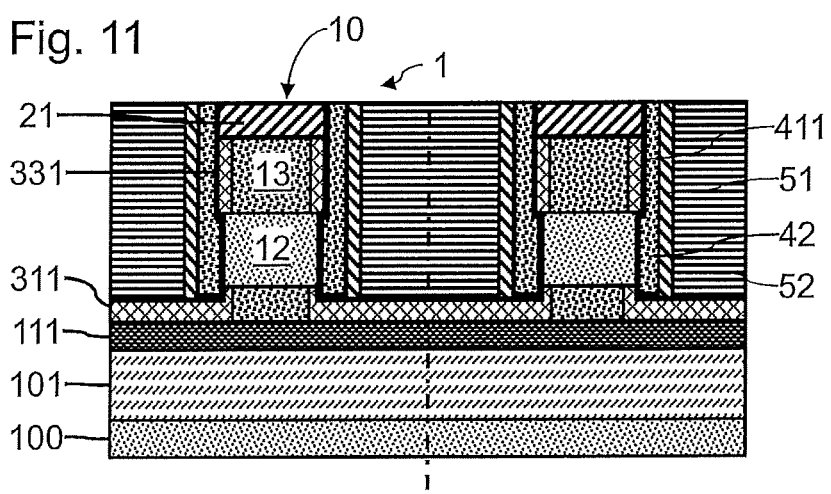

In FIG. 11, a thick dielectric layer 52 is deposited, and then chemical-mechanical polishing is carried out until the upper face of the layer 21 is exposed. The layer 52 is for example made of $SiO_2$ or of TEOS. $SiO_2$ may for example be deposited by an atomic layer deposition process. The layer 52 thus forms a separation between the various stacks 10.

Figure 12:
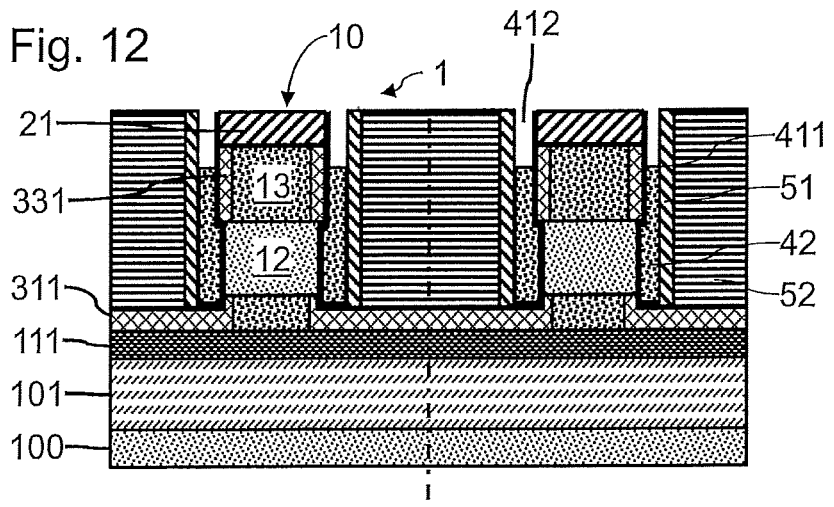

In FIG. 12, the upper portion of the contact portions 411 is selectively wet-etched (for example using sulfuric acid). This etching operation is advantageously carried out to remove the contact portions 411 down to the level of the layer 13, and advantageously before reaching the level of the layer 12. Recesses 412 are thus made above the gates 42.

Figure 13:
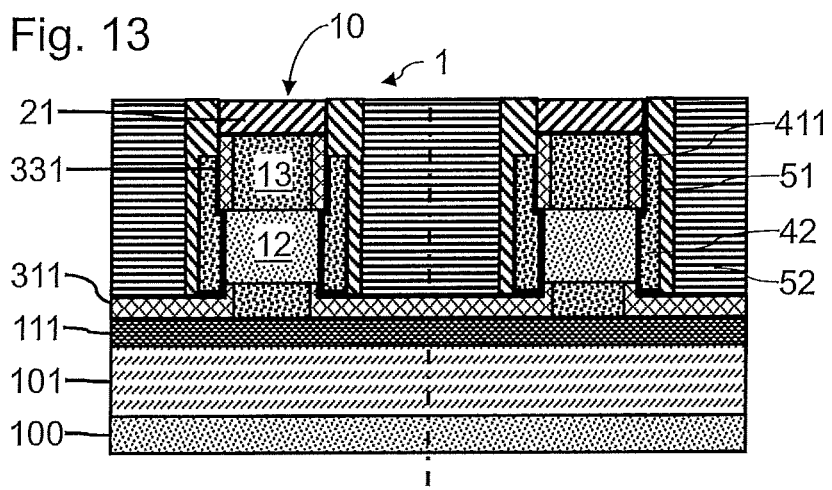

In FIG. 13, the recesses 412 are filled with a dielectric, preferably the same as that of the layer 51. As illustrated in FIG. 13, it is then possible to have a dielectric layer 51 that extends over the gates 42 up to the stack 10, so as to form protection for the gates 42 that are covered by this dielectric layer 51.

Advantageously, the materials of the layer 21, of the layer 51 and of the layer 52 differ and may be etched separately by selective etching operations. Thus, it is possible to define the geometry of the accesses to the layer 13 (to form a drain contact), the geometry of the accesses to the layer 12 (to form a gate contact), and the geometry of the accesses to the layer 111 (to form a source contact) by successive steps of lithography and selective etching.

Figure 14:
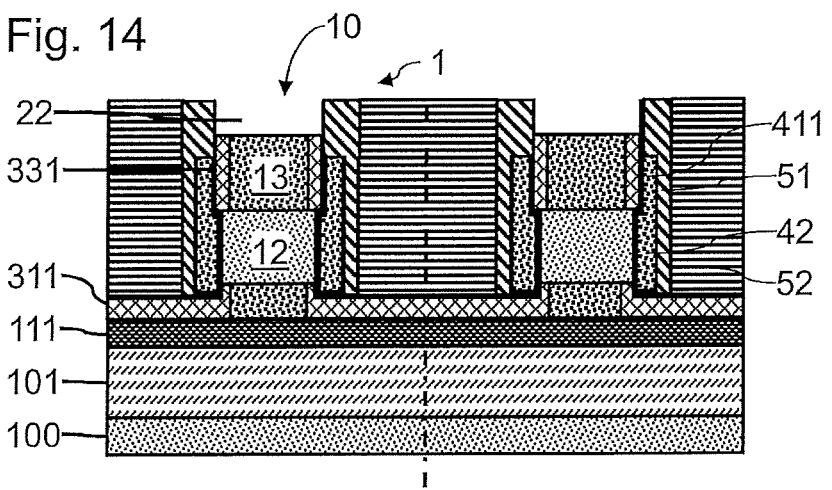
Figure 15:
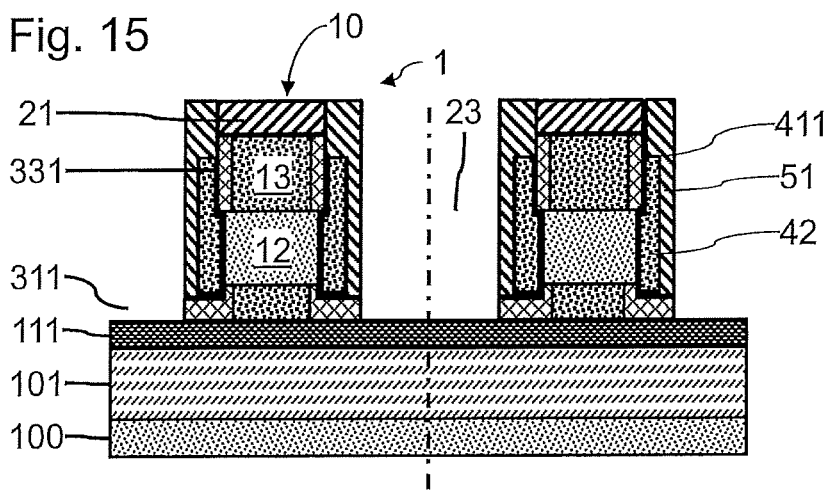

FIGS. 14 to 16 are cross-sectional views of the transistors 1, through various planes, after implementation of the selective etching operations.

In the cross section illustrated in FIG. 14, a portion of the layer 21 has been removed in order to form a void 22, until the upper face of the layer 13 is exposed.

In the cross section illustrated in FIG. 15, a portion of the layer 52 has been removed in order to form a void 23, until the upper face of the layer 111 is exposed, between the stacks 10.

In the cross section illustrated in FIG. 16, a portion of the layer 51 has been removed in order to form a void 24, until the upper portion of the contact portions 411 is exposed.

In later steps, a similar metallization operation may be carried out in order to fill the voids 22 to 24, then an operation of chemical-mechanical polishing may be carried out in order to obtain the shape of the drain, gate and source accesses. The metallization is typically produced with a material chosen from the group consisting of Cu, Co, W, Al and Ti.

It is thus possible to form accesses that make electrical contact with respective drains, accesses that make electrical contact with respective gates, and accesses that make electrical contact with the layer 111, and hence make electrical contact with the source of two transistors 1.

The source access is insulated from the gate access and from the drain access by the layer 51. The gate access is insulated from the drain access by the layer 21, and insulated from the source access by the layer 52.

The first embodiment has been described more specifically for the formation of pMOS transistors. For the formation of an nMOS transistor, the layers 11 and 13 could for example be replaced by n-doped silicon layers, for example phosphorus-doped silicon layers. By using a layer 12 having an n-type doping with a concentration that is significantly lower than that of the layers 11 and 13, the rate of growth of dielectric by thermal oxidation is significantly lower on the side of the layer 12, with respect to that of the layers 11 and 13. The other steps of the process, subsequent to the growth of the thermal oxide for the first embodiment, may be implemented in a similar manner for the formation of the nMOS transistors with these types of layers 11 to 13. Heavily doping layers 11 and 13 with phosphorus allows their access resistance to be decreased.

The document entitled "Thermal oxidation of heavily phosphorus-doped silicon", by C. P. Ho et al., describes in particular various growth rates by thermal oxidation, according to the proportion of phosphorus in a silicon layer and according to the temperature of the thermal oxidation growth process. It is for example possible to envisage forming an oxide layer having a thickness of 10 nm by means of a thermal oxidation process at 800° C. for 10 minutes, for a silicon layer doped with phosphorus with a concentration of $3.10^{20}$ cm$^{-3}$. Under the same temperature conditions, a duration of 60 minutes would be necessary to obtain one and the same oxide thickness with a silicon layer doped with phosphorus with a concentration of $1.10^{15}$ cm$^{-3}$.

FIGS. 17 to 32 are cross-sectional views of an example of a transistor 1 in various steps of an example of a of a second embodiment of a fabricating process according to the invention. The aim of the fabricating process illustrated here is to fabricate two vertical transistors, the sources of which are connected, but it may be applied to the fabrication of other transistor configurations. The aim of the second embodiment is to grow a thermal oxide laterally on a channel layer, with a higher thickness with respect to a thermal oxide at the source and at the drain, in order to be able to benefit from a self-alignment of the gate.

In FIG. 17, a substrate 100 is provided. The substrate 100 is here surmounted by a semiconductor layer 101, which is used as a well. The semiconductor layer 101 is here surmounted by a stack 10 of semiconductor layers. The invention is also applicable in the absence of such a layer 101 between the substrate 100 and the stack 10.

The stack 10 here comprises a layer 11 made of silicon (surmounting the layer 101), a layer 12 made of silicon-germanium alloy formed on the layer 11, and a layer 13 made of silicon formed on the layer 12.

The layer 11 here comprises the superposition of a layer 111 formed on the layer 101, and of a layer 112 formed on the layer 111. The layers 111 and 112 advantageously have, for example, different dopant concentrations, for example with a view to decreasing the access resistance of the source of the transistor 1 to be formed. The layer 112 here has the same composition as the layer 13. The invention applies, of course, to a layer 11 having a uniform composition. The silicon-germanium alloy of the layer 12 may be doped with boron for example with a dopant concentration comprised between $5 \times 10^{19}$ cm$^{-3}$ and $5 \times 10^{20}$ cm$^{-3}$ and preferably equal to $2 \times 10^{20}$ cm$^{-3}$.

The stack of the layers 11 to 13 may be obtained beforehand via epitaxial growth steps, in a manner known per se. The materials of the layers 11 to 13 are selected according to the electrical performance levels desired for the transistor 1, and so as to be able to grow a thermal oxide laterally from the layer 12 at a different rate of growth than that of thermal oxides formed laterally from the layers 11 and 13. The type of doping of the layer 101 is advantageously opposite to that of the layer 111, in order to limit leakages in the direction of the substrate 100.

The stack of the layers 11 to 13 here has a thickness typically comprised between 10 and 300 nanometers. The layer 12 has a thickness typically comprised between 5 and 100 nm (15 nm for example), the definition of its thickness facilitating the definition of the electrical length of the channel. The layers 11 and 13 may have the same thickness or different thicknesses, for example with a view to adjusting their electrical resistances. The layers 11 and 13 typically have respective thicknesses comprised between 3 and 100 nm (20 nm for example). In order to decrease the contact resistance at the source or drain of a transistor 1, their thickness is advantageously at most equal to 15 nm. A lower value for the respective thicknesses of the layers 11 to 13 also facilitates the later formation of spacers.

The layer 13 is covered with a dielectric layer 21. The dielectric layer 21 is typically made of SiN, of SiO$_2$ or of a combination of these two materials. The layer 21 forms a hard mask for the stack. The layer 21 here has a width comprised between 10 and 100 nanometers (40 nm for example), corresponding to the width ct that is desired to be defined for the stack.

In FIG. 18, the dielectric layer 21 is used for anisotropically etching the layers 13, 12 and 112, so that they have substantially one and the same length and one and the same width, corresponding to the pattern of the dielectric layer 21. An RIE etching operation of the same type as that used to etch the stack of the layers 11, 12 and 13 may be carried out. The etching operation is interrupted when the layer 111 is exposed on the side of the stacks 10.

Figure 19:
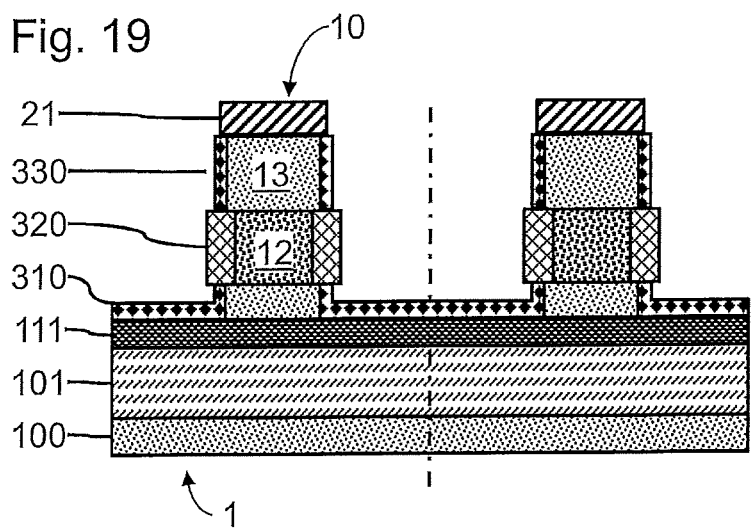

In FIG. 19, a step of growing dielectric by thermal oxidation on the sides of the layers 112, 12 and 13 is implemented. Dielectric is also grown vertically on the layer 111. The dielectrics are formed by thermal oxidation of the layers 111, 112, 12 and 13, respectively (for example rapid thermal oxidation at a process temperature that is typically comprised between 750 and 1150° C.). On completion of this step, a dielectric layer 330 is formed laterally on the layer 13, a dielectric layer 320 is formed laterally on the layer 12, and a dielectric layer 310 is formed laterally on the layer 112 and vertically on the layer 111.

With a layer 12 having a proportion of germanium that is significantly higher than that of the layers 13, 111 and 112, the rate of growth of the dielectric by thermal oxidation on the side of the layer 12 is much higher than the rate of growth of dielectric by thermal oxidation on the side of the layers 13 and 112. Thus, on completion of the thermal oxidation step, the thickness (the dimension in the horizontal direction) of the dielectric layer 320 is strictly higher than that of the dielectric layer 330 or than that of the dielectric layer 310. It is possible, for example, to envisage forming a dielectric layer 320 having a thickness of 10 nm, for a dielectric layer 330 having a thickness comprised between 1 and 5 nm. The difference in growth rate can be observed at the interface between the layer 12 and the layers 112 and 13, respectively. Consequently, the layer 320 is vertically self-aligned with the interfaces of the layer 12 with the layers 13 and 112, respectively. With a layer 13 and a layer 112 having the same composition, the rate of lateral growth of the dielectric layers 310 and 330 is identical.

Figure 20:
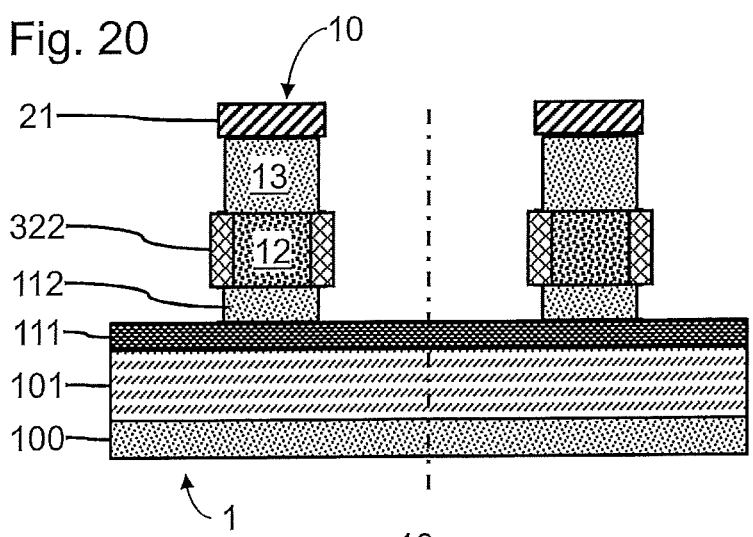

In FIG. 20, the layers 310, 320 and 330 are isotropically etched:
to a thickness that is sufficient to remove the dielectric layers 310 and 330;
to a thickness that is low enough to retain a portion of the dielectric layer 320. Sacrificial spacers 322 are thus formed on either side of the layer 12.

It is possible to use an isotropic etching process for which the etching speed is substantially identical for the various dielectric layers 310, 320 and 330.

Figure 21:
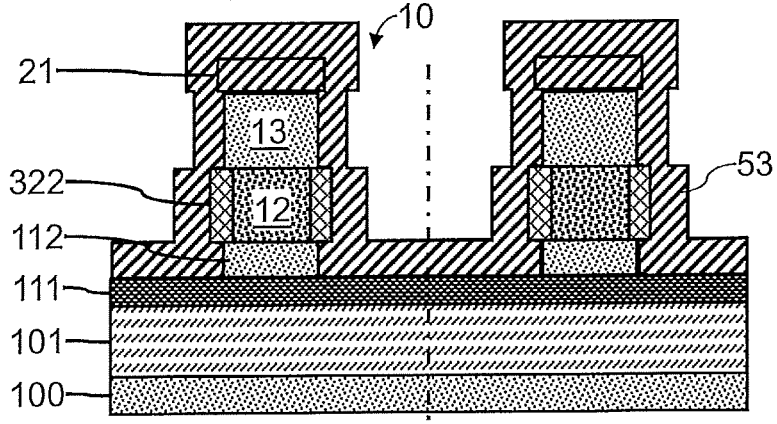

In FIG. 21, a dielectric layer 53 is deposited by conformal deposition. In this example, the dielectric of the layer 53 is for example SiN. The dielectric of the layer 53 is for example deposited to a thickness comprised between 5 and 10 nm. The layer 53 then covers, in particular, the lateral faces of the layers 112 and 13. The layer 53 is intended to form spacers for the layers 112 and 13.

Figure 22:
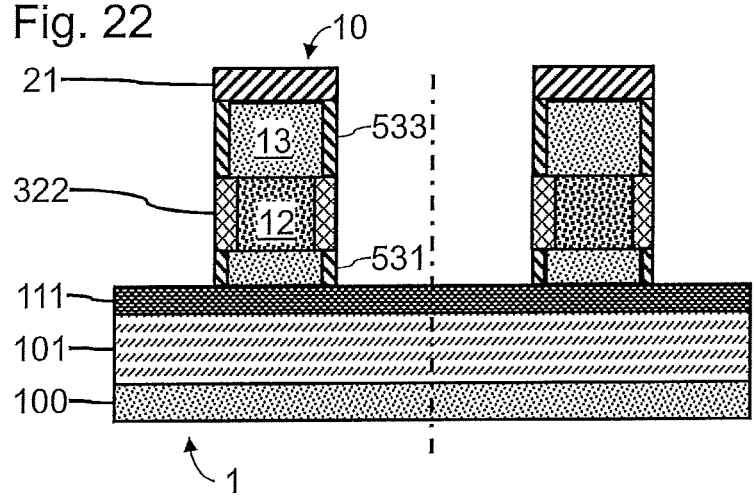

In FIG. 22, the layer 53 is anisotropically etched, so as to expose the upper face of the dielectric layer 21 and so as to expose the upper face of the layer 111 on either side of the stacks 10. The layer 53 is preserved on either side of the layers 112 and 13. Spacers 531 and 533 are made on either side of the layers 112 and 13, respectively. An RIE-ICP etching operation that is reasonably anisotropic may be carried out by using the dielectric layer 21 as an etching mask. The spacers 531, 533 and the sacrificial spacers 322 are horizontally self-aligned with the dielectric layer 21 on completion of this etching operation.

Figure 23:
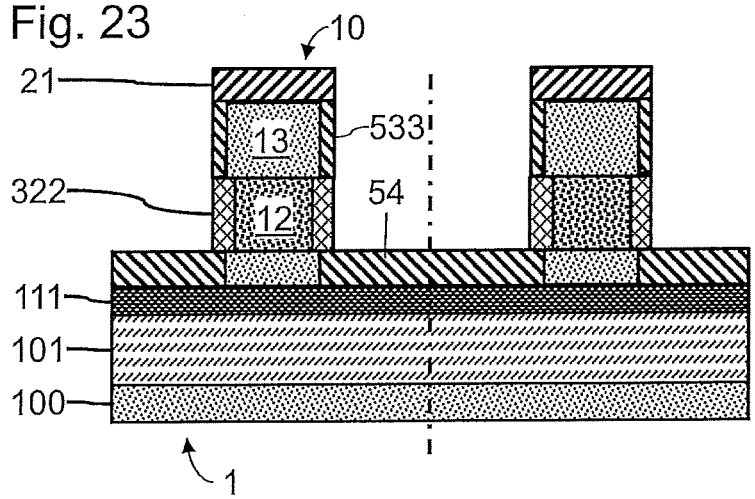

In FIG. 23, a dielectric is deposited by non-conformal deposition in order to form a layer 54 on the layer 111, to a height corresponding substantially to that of the spacers 531. Such a deposition operation may for example be a PVD operation. The dielectric of the layer 54 is advantageously the same as that of the layer 53. The layer 54 deposited on the stacks 10 has here been removed by a step of chemical-mechanical polishing.

Figure 24:
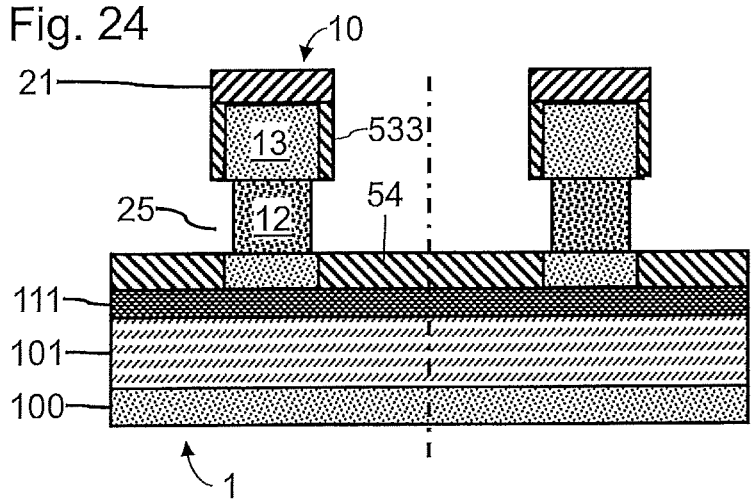

In FIG. 24, the sacrificial spacers 322 are removed by selective etching. Voids 25 that are vertically self-aligned with the layer 12 are then present. The voids 25 are of course also self-aligned both with the layer 13 and the spacers 533, and with the layer 112 and the layer 54, including the spacers 531. The operation of etching the sacrificial spacers 322 is for example a dry etching operation such as atomic layer etching (ALE) or reactive ion etching (RIE).

In FIG. 25, a dielectric layer 420 is deposited by conformal deposition. In this example, the dielectric of the layer 420 is an Hk dielectric, i.e. it has a dielectric constant at least equal to 6. The dielectric of the layer 420 is for example $HfO_2$ (for example deposited by atomic layer deposition). The dielectric of the layer 420 is for example deposited to a thickness of at most 3 nm. Advantageously, an interface layer (not shown here), for example made of $SiO_2$ having a thickness comprised between 1 and 2 nm, may be deposited beforehand. The layer 420 then covers, in particular, the lateral faces of the layer 12, in the recesses 25. The layer 420 is intended to form the gate insulator. In the configuration illustrated in FIG. 25, an anisotropic etching operation is additionally carried out in order to remove the layer 420 from all of the surfaces outside of the recesses 25 (for example plasma etching including Ar, $BCl_3$, or $Cl_2$).

In FIG. 26, a conductive layer 421 is deposited by conformal deposition. In this example, the gate material, corresponding to the layer 421, is TiN. The material of the layer 421 is for example deposited to a thickness of at least 3 nm. The layer 421 is in particular deposited on the layer 420. The layer 421 forming the gate material is for example deposited with an atomic layer deposition process.

In FIG. 27, the layer 421 is etched, so as to expose the upper face of the dielectric layer 21 and so as to expose the layer 54 on either side of the stacks 10. The layer 421 is preserved on either side of the layers 12 and 13. A gate 42 is then made on either side of the layer 12 (on the lateral faces of the layer 12). Each gate 42 is extended vertically upward by a contact portion 411, on either side of the layer 11. Each gate 42 is electrically insulated from the layer 111 via the dielectric layer 54. For a layer 421 of sufficient thickness, isotropic etching may be carried out. If the layer 421 is made of TiN, isotropic RIE or ICP etching may be carried out, for example. The gate 42 thus obtained thus exhibits vertical self-alignment with respect to the layer 12.

The process may be implemented so as to form a gate 42 girdling the entire layer 12. A gate-all-around transistor 1 may thus be formed, the entire channel zone then being girdled by the gate 42. The gate 42 may thus be biased to one and the same potential all around the layer 12 forming the channel zone.

Figure 41:
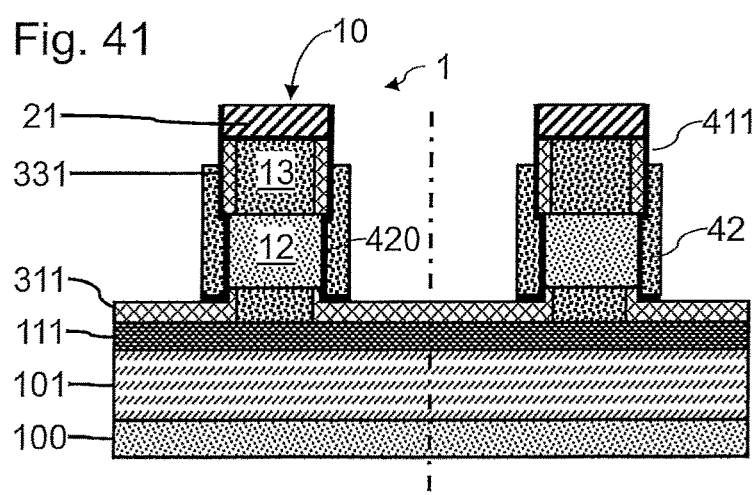
FIG. 41 illustrates a step of one variant fabricating process that may be implemented according to the first embodiment of the invention.

According to one optional variant illustrated in FIG. 41, on completion of the step illustrated with reference to FIG. 27, an upper portion of the contact portion 411 may be removed, with a view to facilitating the formation of a spacer extending over this contact portion 411.

Figure 28:
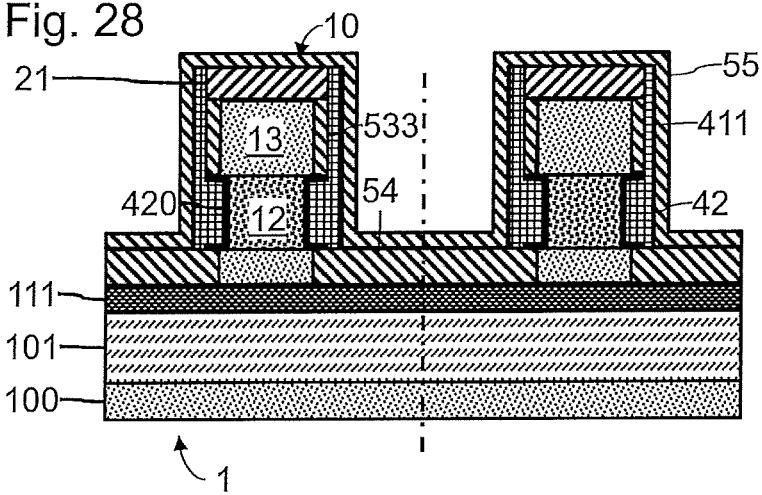

In FIG. 28, on completion of the step illustrated with reference to FIG. 27, a dielectric layer 55 is deposited by conformal deposition. The layer 55 is for example an SiBCN layer, for example made of a material identical to that of the layer 21. Each stack 10 is thus encapsulated in the layer 55. Similarly, the gate 42 and the contact portion 411 of a transistor 1 are encapsulated in the layer 55. The layer 55 has for example a thickness of 10 nm and may for example be deposited by an atomic layer deposition process.

Figure 29:
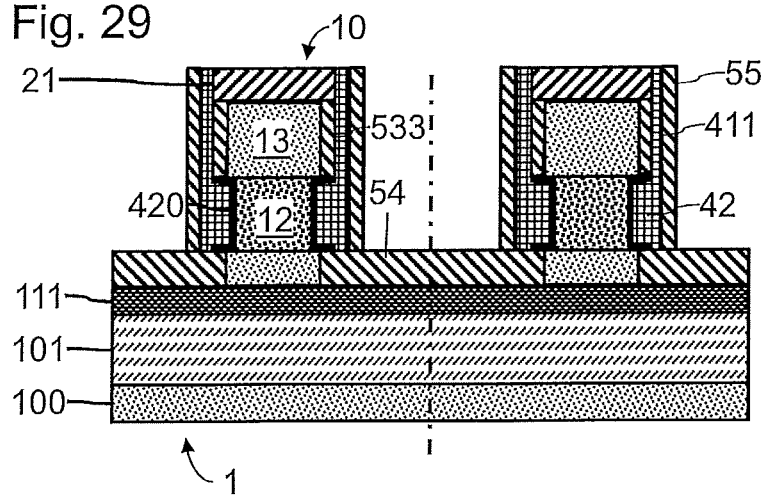

In a step shown in FIG. 29, the layer 55 is anisotropically etched to a thickness that is sufficient to expose the upper face of the layer 21 and of the dielectric layer 54, while retaining this layer 55 on either side of the stacks 10.

Figure 30:
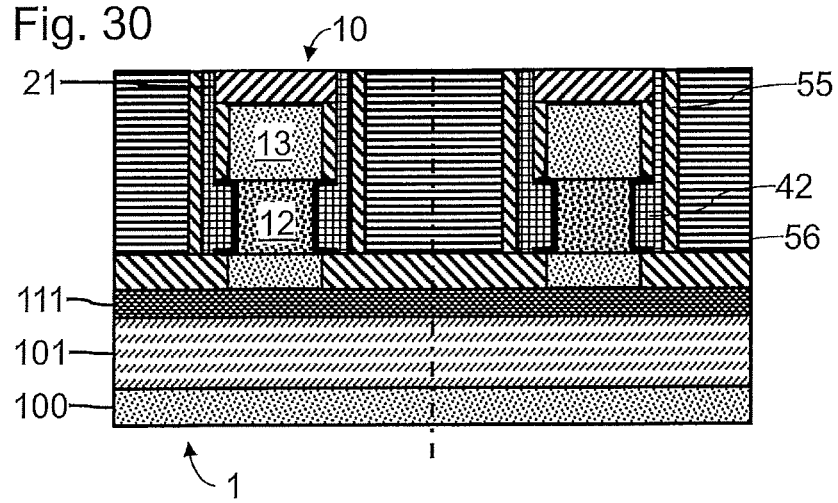

In FIG. 30, a thick dielectric layer 56 is deposited, and then chemical-mechanical polishing is carried out until the upper face of the layer 21 is exposed. The layer 56 is for example made of $SiO_2$ or of TEOS. $SiO_2$ may for example be deposited by an atomic layer deposition process. The layer 56 thus forms a separation between the various stacks 10.

Figure 31:
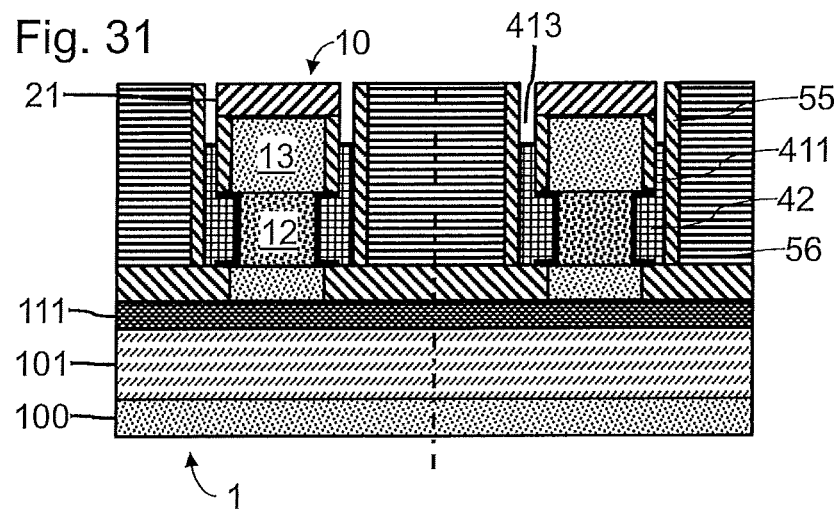

In FIG. 31, the upper portion of the contact portions 411 is selectively wet-etched (for example using sulfuric acid). This etching operation is advantageously carried out to remove the contact portions 411 down to the level of the layer 13, and advantageously before reaching the level of the layer 12. Recesses 413 are thus made above the gates 42.

Figure 32:
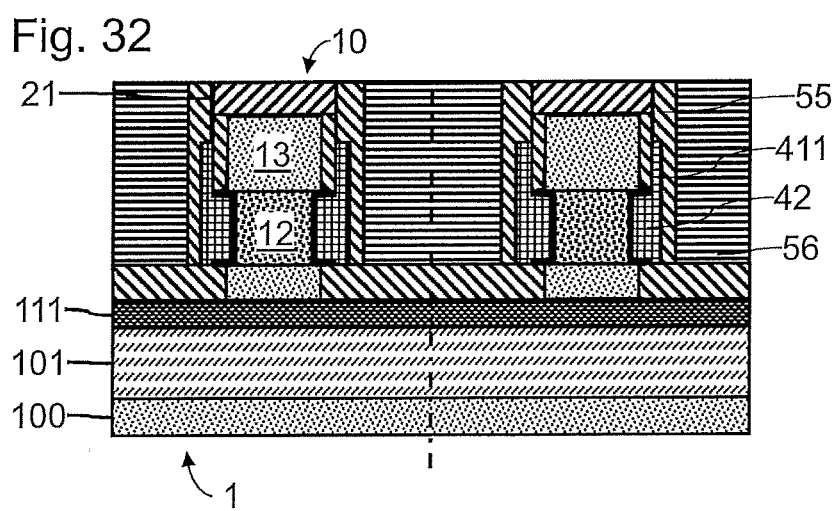

In FIG. 32, the recesses 413 are filled with a dielectric, preferably the same as that of the layer 55. As illustrated in FIG. 32, it is then possible to have a dielectric layer 55 that extends beyond the gates 42 up to the stack 10, so as to form protection for the gates 42 that are covered by this dielectric layer 55.

The later steps of forming respective accesses to the drain, to the source and to the gate of each transistor 1 will not be described further and may for example be implemented in a manner similar to that of the first embodiment.

FIGS. 33 to 40 are cross-sectional views of an example of a transistor 1 in different steps of an example of a third embodiment of a fabricating process according to the invention. The aim of the fabricating process illustrated here is to fabricate two vertical transistors, the sources of which are connected, but it may be applied to the fabrication of other transistor configurations. The aim of the third embodiment is to grow a thermal oxide laterally on a channel layer, with a different composition than that of the thermal oxides at the source and at the drain. By etching selectively according to the materials of the various oxides, it is possible to benefit from a self-alignment of the gate.

Figure 33:
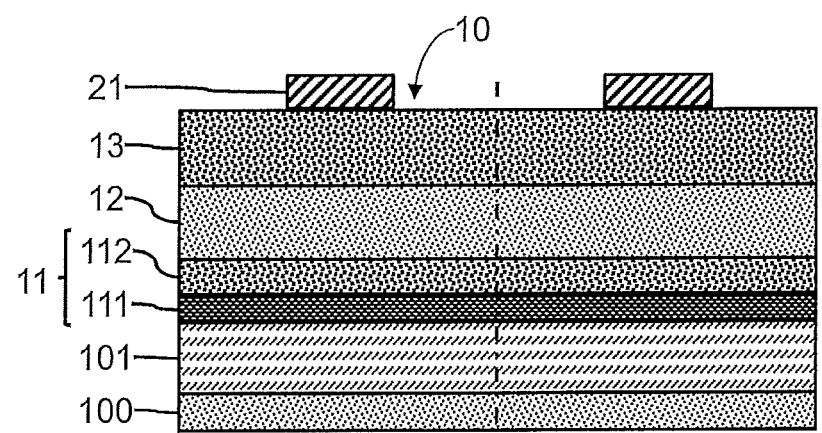
FIGS. 33 to 40 are cross-sectional views during various steps of a process for fabricating vertical-channel field-effect transistors according to one example of a third embodiment of the invention.

In FIG. 33, a substrate 100 is provided. The substrate 100 is here surmounted by a semiconductor layer 101, which is used as a well. The semiconductor layer 101 is here surmounted by a stack 10 of semiconductor layers. The invention is also applicable in the absence of such a layer 101 between the substrate 100 and the stack 10.

The stack 10 here comprises a layer 11 made of SiGe (surmounting the layer 101), a layer 12 made of Si formed on the layer 11, and a layer 13 made of SiGe formed on the layer 12. The SiGe and the Si naturally lead to lateral growths of thermal oxides of different natures. The document "Selective GeOx-Scavenging from Interfacial Layer on Si1-xGex Channel for High Mobility Si/Si1-xGex CMOS Application", published by C. H. Lee et al., in 2016 Symposium on VLSI Technology Digest of Technical Papers, describes parameters for forming interfacial layers on silicon alloy layers having various germanium concentrations.

The layer 11 here comprises the superposition of a layer 111 formed on the layer 101, and of a layer 112 formed on the layer 111. The layers 111 and 112 advantageously have, for example, different dopant concentrations, for example with a view to decreasing the access resistance of the source of the transistor 1 to be formed. The layer 112 here has the same composition as the layer 13. The invention applies, of course, to a layer 11 having a uniform composition.

The stack of the layers 11 to 13 may be obtained beforehand via epitaxial growth steps, in a manner known per se. The materials of the layers 11 to 13 are selected according to the electrical performance levels desired for the transistor 1, and so as to be able to grow a thermal oxide laterally from the layer 12 with a different composition than that of thermal oxides formed laterally from the layers 11 and 13. The differences in composition of the thermal oxides must allow one of the thermal oxides to be selectively etched with respect to the other. The type of doping of the layer 101 is advantageously opposite to that of the layer 111, in order to limit leakages in the direction of the substrate 100.

The stack of the layers 11 to 13 here has a thickness typically comprised between 10 and 300 nanometers. The layer 12 has a thickness typically comprised between 5 and 100 nm (15 nm for example), the definition of its thickness facilitating the definition of the electrical length of the channel. The layers 11 and 13 may have the same thickness or different thicknesses, for example with a view to adjusting their electrical resistances. The layers 11 and 13 typically have respective thicknesses comprised between 3 and 100 nm (20 nm for example). In order to decrease the contact resistance at the source or drain of a transistor 1, their thickness is advantageously at most equal to 15 nm. A lower value for the respective thicknesses of the layers 11 to 13 also facilitates the later formation of spacers.

The layer 13 is covered with a dielectric layer 21. The dielectric layer 21 is typically made of SiN, of $SiO_2$ or of a combination of these two materials. The layer 21 forms a hard mask for the stack. The layer 21 here has a width comprised between 10 and 100 nanometers (40 nm for example), corresponding to the width ct that is desired to be defined for the stack.

Figure 34:
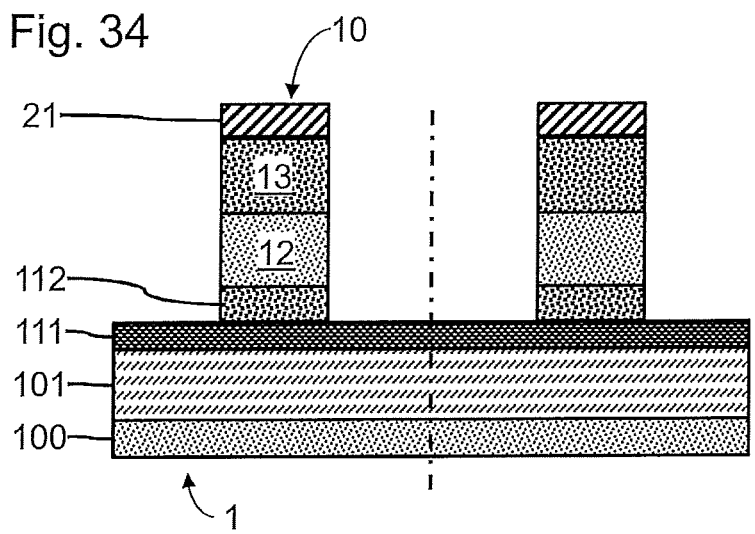

In FIG. 34, the dielectric layer 21 is used for anisotropically etching the layers 13, 12 and 112, so that they have substantially one and the same length and one and the same width, corresponding to the pattern of the dielectric layer 21. A reactive ion etching (RIE) operation may in particular be implemented. The etching operation is interrupted when the layer 111 is exposed on the side of the stacks 10.

Figure 35:
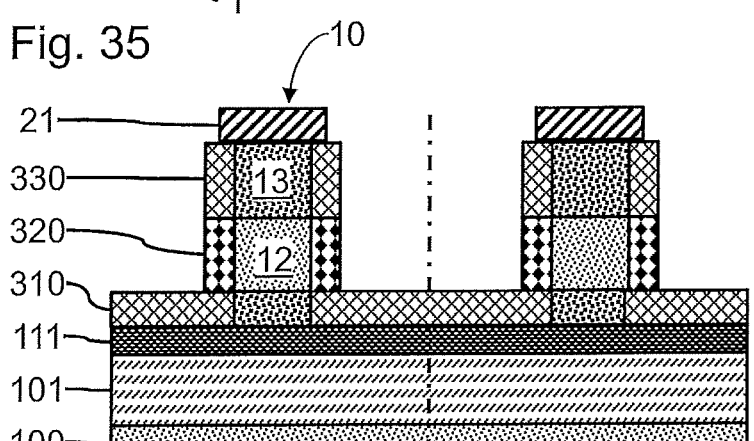

In FIG. 35, a step of growing dielectric by thermal oxidation on the sides of the layers 112, 12 and 13 is implemented. Dielectric is also grown vertically on the layer 111. The dielectrics are formed by thermal oxidation of the layers 111, 112, 12 and 13, respectively (for example rapid thermal oxidation at a process temperature that is typically comprised between 750 and 1150° C.). On completion of this step, a dielectric layer 330 is formed laterally on the layer 13, a dielectric layer 320 is formed laterally on the layer 12, and a dielectric layer 310 is formed laterally on the layer 112 and vertically on the layer 111. The composition of the layer 320 is different from that of the dielectric layers 310 and 330. The layer 320 and the layers 310 and 330 may undergo selective etching due to their differences in composition. The thicknesses of the layers 310, 320 and 330 are here identical, but it is also possible to envisage these thicknesses being different.

Figure 36:
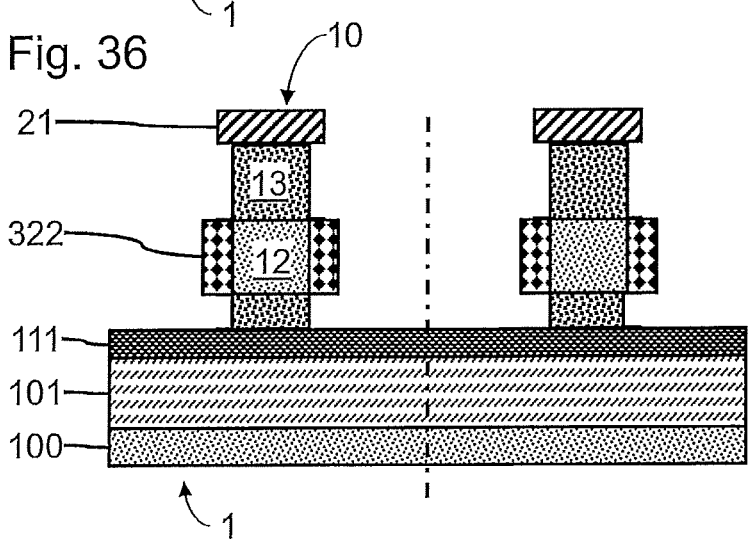

In FIG. 36, the layers 310 and 330 are selectively etched, so as to retain the dielectric layer 320, forming sacrificial spacers 322 on either side of the layer 12.

Figure 37:
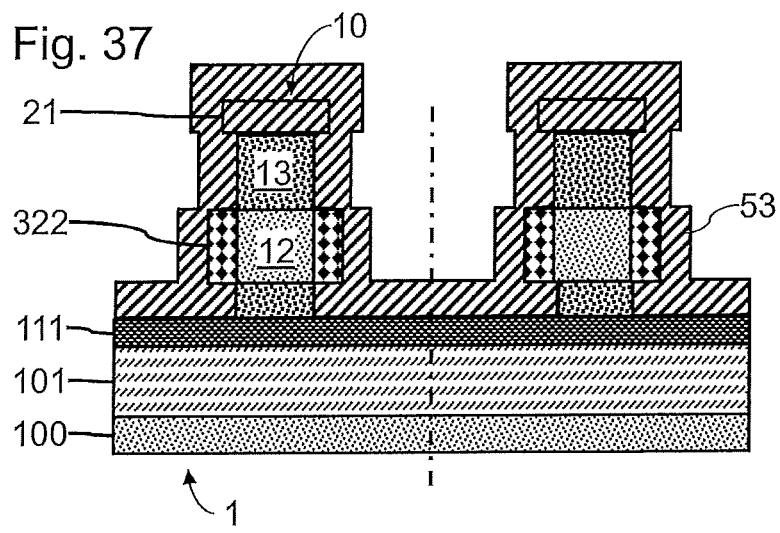

In FIG. 37, a dielectric layer 53 is deposited by conformal deposition. In this example, the dielectric of the layer 53 is for example SiN. The dielectric of the layer 53 is for example deposited to a thickness comprised between 5 and 10 nm. The layer 53 then covers, in particular, the lateral faces of the layers 112 and 13. The layer 53 is intended to form spacers for the layers 112 and 13.

Figure 38:
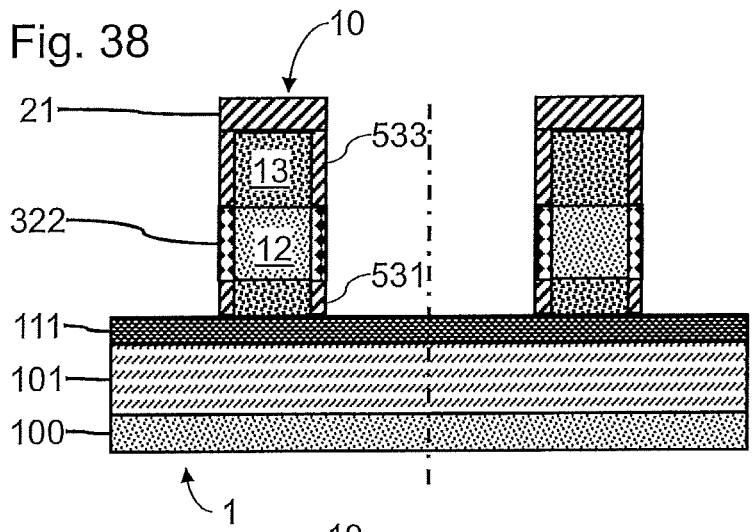

In FIG. 38, the layer 53 is anisotropically etched, so as to expose the upper face of the dielectric layer 21 and so as to expose the upper face of the layer 111 on either side of the stacks 10. The layer 53 is preserved on either side of the layers 112 and 13. Spacers 531 and 533 are made on either side of the layers 112 and 13, respectively. An RIE-ICP etching operation that is reasonably anisotropic may be carried out by using the dielectric layer 21 as an etching mask. The spacers 531, 533 and the sacrificial spacers 322 are horizontally self-aligned with the dielectric layer 21 on completion of this etching operation.

Figure 39:
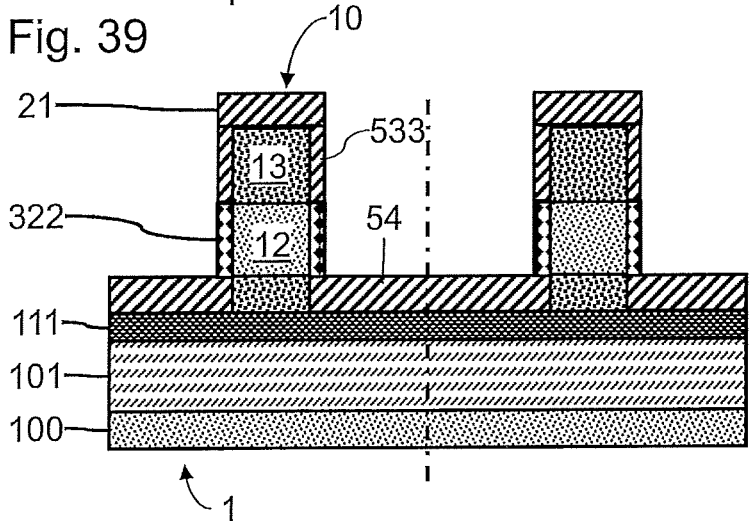

In FIG. 39, a dielectric is deposited by non-conformal deposition in order to form a layer 54 on the layer 111, to a height corresponding substantially to that of the spacers 531. The dielectric of the layer 54 is advantageously the same as that of the layer 53. The layer 54 deposited on the stacks 10 has here been removed by a step of chemical-mechanical polishing.

Figure 40:
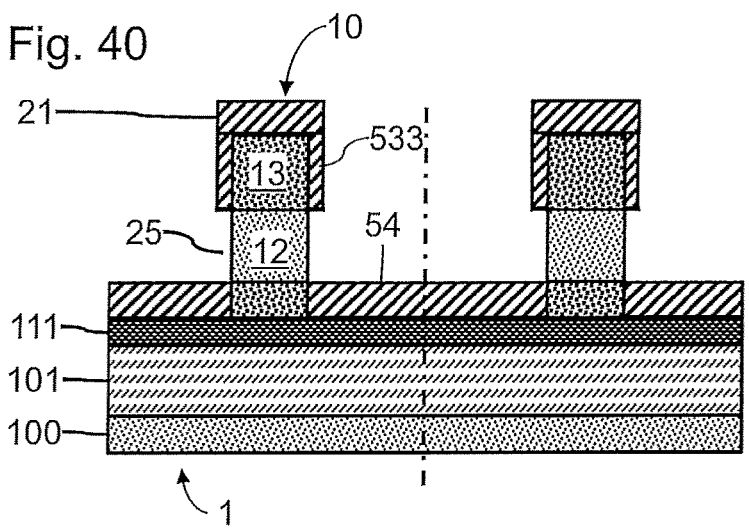

In FIG. 40, the sacrificial spacers 322 are removed by selective etching. Voids 25 that are vertically self-aligned with the layer 12 are then present. The voids 25 are of course also self-aligned both with the layer 13 and the spacers 533, and with the layer 112 and the layer 54, including the spacers 531. The operation of etching the sacrificial spacers 322 is for example a dry etching operation such as atomic layer etching (ALE) or reactive ion etching (RIE).

The later steps of forming the gate and of forming respective accesses to the drain, to the source and to the gate of each transistor 1 will not be described further and may for example be implemented in a manner similar to that of the second embodiment.

In the examples described above, processes for horizontally growing dielectric layers by thermal oxidation have been described. Other ways of growing dielectric layers by oxidation may be envisaged, for example wet oxidation processes, for example by means of a mixture of water and peroxide, or by means of water with ozone degassing.

The invention claimed is:

1. A process for fabricating a vertical transistor, wherein it comprises the steps of:
   providing a substrate surmounted by a vertical stack of first, second and third layers made of first, second and third semiconductors, respectively, said second semiconductor being different from the first and third semiconductors;
   horizontally growing first, second and third dielectric layers, by oxidation, from the first, second and third semiconductor layers, respectively, the oxidation generating a second dielectric layer, the thickness of which in said horizontal direction differs from the thickness of said first and third dielectric layers, or a second dielectric layer, the composition of which differs from the composition of said first and third dielectric layers;
   removing the second dielectric layer so as to form a recess that is vertically self-aligned with the second semiconductor layer, said recess being positioned vertically between first and second blocks that are made facing the first and third semiconductor layers, respectively;
   forming a gate stack in said self-aligned recess.

2. The process for fabricating a vertical transistor as claimed in claim 1, wherein said oxidation generates a second dielectric layer, the thickness of which differs from that of the first and third dielectric layers, said process comprising a step of etching the first to third dielectric layers to one and the same thickness, either to remove the second dielectric layer and to retain at least a portion of the first and third dielectric layers, or to remove the first and third dielectric layers and to retain at least a portion of the second dielectric layer.

3. The process for fabricating a vertical transistor as claimed in claim 2, wherein said oxidation generates a second dielectric layer, the thickness of which is strictly lower than that of the first and third dielectric layers, wherein said recess is made between said first and third dielectric layers forming said first and second blocks, respectively.

4. The process for fabricating a vertical transistor as claimed in claim 2, wherein said oxidation generates a second dielectric layer, the thickness of which is strictly higher than that of the first and third dielectric layers, the process comprising a step of forming fourth and fifth dielectric layers against the first and third semiconductor layers after removing the first and third dielectric layers, wherein said recess is made between said fourth and fifth dielectric layers forming said first and second blocks, respectively.

5. The process for fabricating a vertical transistor as claimed in claim 2, wherein said first to third semiconductor layers are silicon-based layers, said second semiconductor layer having a concentration of phosphorus that differs from that of the first and third semiconductor layers.

6. The process for fabricating a vertical transistor as claimed in claim 2, wherein said first to third semiconductor layers are silicon-based layers, said second semiconductor layer having a concentration of germanium that differs from that of the first and third semiconductor layers.

7. The process for fabricating a vertical transistor as claimed in claim 1, wherein said oxidation generates a second dielectric layer, the composition of which differs from the composition of said first and third dielectric layers, said process comprising either a step of selectively etching the second dielectric layer with respect to the first and third dielectric layers so as to remove the second dielectric layer and to retain at least a portion of the first and third dielectric layers, or a step of selectively etching the first and third dielectric layers with respect to the second dielectric layer so as to remove the first and third dielectric layers and to retain at least a portion of the second dielectric layer.

8. The process for fabricating a vertical transistor as claimed in claim 7, wherein the process comprises an operation of selectively etching the first and third dielectric layers with respect to the second dielectric layer so as to remove the first and third dielectric layers and to retain at least a portion of the second dielectric layer, the process comprising a step of forming sixth and seventh dielectric layers against the first and third semiconductor layers after removing the first and third dielectric layers, wherein said recess is made between said sixth and seventh dielectric layers forming said first and second blocks, respectively.

9. The process for fabricating a vertical transistor as claimed in claim 1, wherein the formation of the gate stack comprises the formation of a gate insulator layer in said recess and the formation of a conductor on said gate insulator layer.

10. The process for fabricating a vertical transistor as claimed in claim 1, wherein said formed recess girdles said second semiconductor layer.

11. The process for fabricating a vertical transistor as claimed in claim 1, wherein said first semiconductor layer has an upper portion and a lower portion, said lower portion extending laterally beyond said upper portion for the provided substrate, said growth by oxidation generating a vertical growth of a lateral portion of the first dielectric layer from said lower portion of the first semiconductor layer, said gate stack being formed on said lateral portion of the first dielectric layer.

12. The process for fabricating a vertical transistor as claimed in claim 1, wherein said providing step is preceded by steps of:
forming a hard-mask pattern on the third semiconductor layer;
transferring the pattern of the hard mask to the first to third semiconductor layers by anisotropic etching.

13. The process for fabricating a vertical transistor as claimed in claim 12, furthermore comprising steps of:
forming a seventh dielectric layer against a lateral face of said gate stack, the seventh dielectric layer being in a different material from the hard mask;
forming an eighth dielectric layer against a lateral face of the seventh dielectric layer, the eighth dielectric layer being in a different material from the hard mask and from the seventh dielectric layer;
forming an etching pattern by photolithography;
transferring the pattern of the hard mask to the eighth dielectric layer and to a portion of the seventh dielectric layer by means of successive selective etching operations so as to form respective recesses;
depositing a conductor in said recesses so as to form drain, source and gate contacts, respectively.

14. The process for fabricating a vertical transistor as claimed in claim 1, wherein said step of horizontal growth of the first, second and third dielectric layers is implemented by thermal oxidation.

15. The process for fabricating a vertical transistor as claimed in claim 1, wherein said step of horizontal growth of the first, second and third dielectric layers is implemented by wet oxidation.

* * * * *